United States Patent
Yao et al.

(10) Patent No.: US 10,847,417 B1
(45) Date of Patent: Nov. 24, 2020

(54) METHODS OF FORMING INTERCONNECT STRUCTURES IN SEMICONDUCTOR FABRICATION

(71) Applicant: Taiwan Semiconductor Manufacturing Co., Ltd., Hsin-Chu (TW)

(72) Inventors: Hsin-Chieh Yao, Hsinchu (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/547,083

(22) Filed: Aug. 21, 2019

(51) Int. Cl.
*H01L 21/768* (2006.01)
*H01L 21/8234* (2006.01)
*H01L 23/528* (2006.01)
*H01L 23/532* (2006.01)
*H01L 23/522* (2006.01)
*H01L 21/311* (2006.01)

(52) U.S. Cl.
CPC .. *H01L 21/76897* (2013.01); *H01L 21/31111* (2013.01); *H01L 21/76802* (2013.01); *H01L 21/76831* (2013.01); *H01L 21/76877* (2013.01); *H01L 21/823475* (2013.01); *H01L 23/5226* (2013.01); *H01L 23/5283* (2013.01); *H01L 23/53295* (2013.01)

(58) Field of Classification Search
None
See application file for complete search history.

(56) References Cited

U.S. PATENT DOCUMENTS

| 7,084,070 B1 * | 8/2006 | Lee | H01L 21/31111 |
| | | | 134/1.1 |
| 9,412,648 B1 * | 8/2016 | Shiu | H01L 21/76816 |
| 2019/0221523 A1 * | 7/2019 | Singh | H01L 21/31138 |

* cited by examiner

*Primary Examiner* — J.E. Schoenholtz
(74) *Attorney, Agent, or Firm* — Haynes and Boone, LLP

(57) ABSTRACT

A method includes forming a first conductive feature and a second conductive feature adjacent the first conductive feature in a first dielectric layer, where the first dielectric layer includes a first dielectric material, and forming a dielectric feature in the first dielectric layer, where the dielectric feature contacts sidewalls of the first and the second conductive features and where the dielectric feature includes a second dielectric material different from the first dielectric material. The method further includes forming a second dielectric layer over the first dielectric layer, where the second dielectric layer includes a third dielectric material different from the second dielectric material, and forming a third conductive feature in the second dielectric layer, where the third conductive feature contacts a sidewall of the dielectric feature and either a top surface of the first conductive feature or a top surface of the second conductive feature.

20 Claims, 7 Drawing Sheets

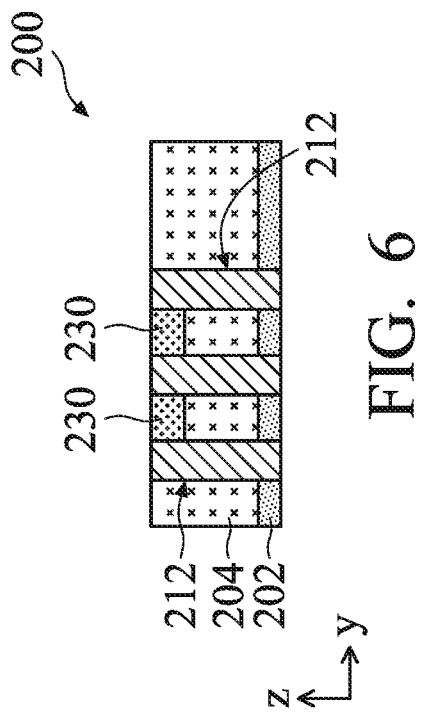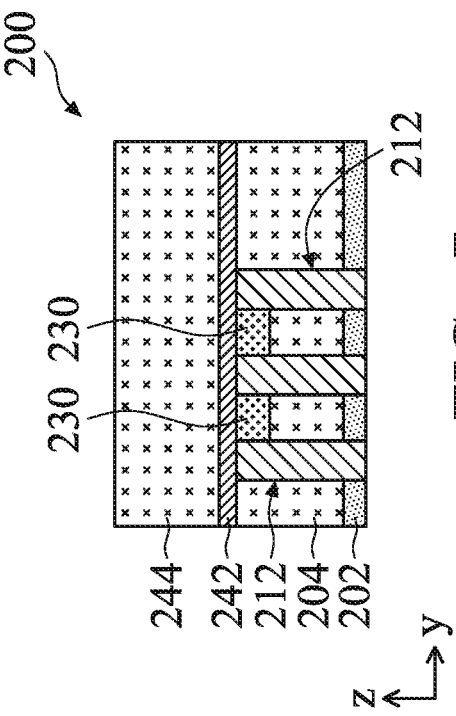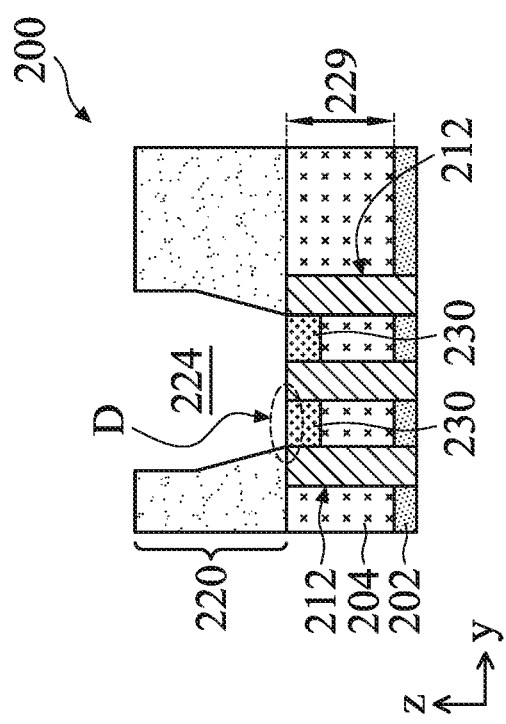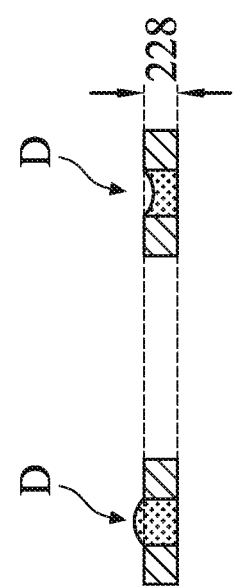

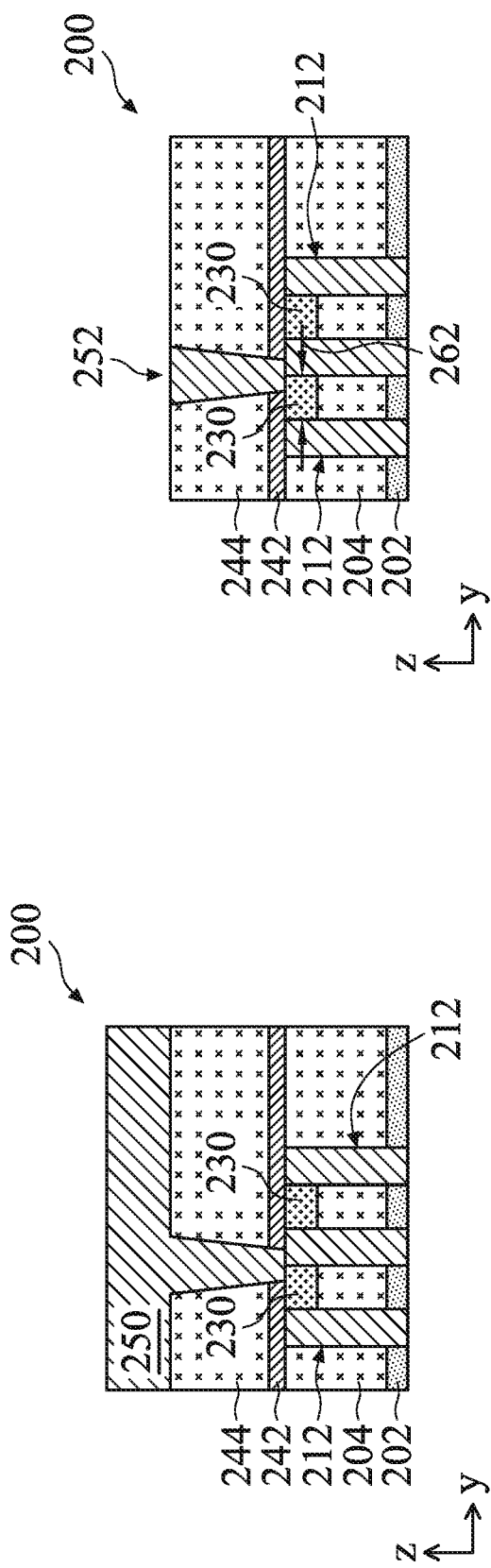
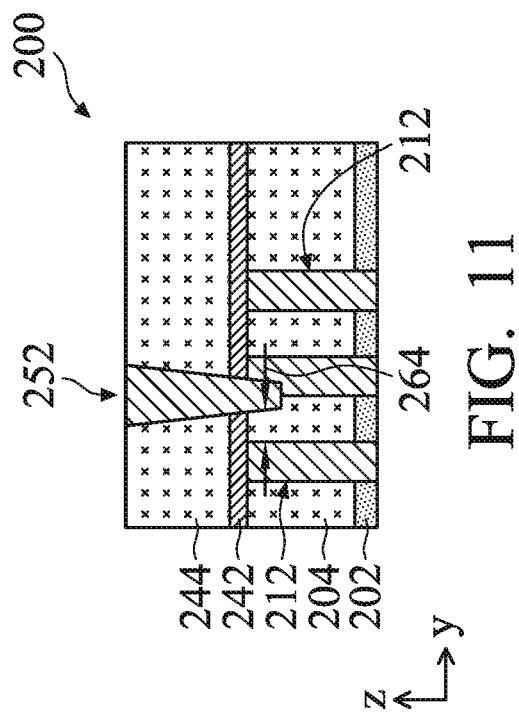

METHODS OF FORMING INTERCONNECT STRUCTURES IN SEMICONDUCTOR FABRICATION

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, reduced device sizes generally lead to smaller processing windows available for fabricating various device features. Any unintentional misalignment (e.g., overlay errors) during lithography processes may enlarge the critical dimension of interconnect structures (e.g., vias) and cause shortcomings in device performance. Accordingly, although existing interconnect structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4, 5A, 5B, 5C, 6, 7, 8A, 8B, 8C, 8D, 9, 10, 11, and 12A are cross-sectional views of an interconnect structure, in portion or entirety, at various fabrication stages (such as those associated with the method of FIG. 2) according to various aspects of the present disclosure.

DETAILED DESCRIPTION

Figure 1:
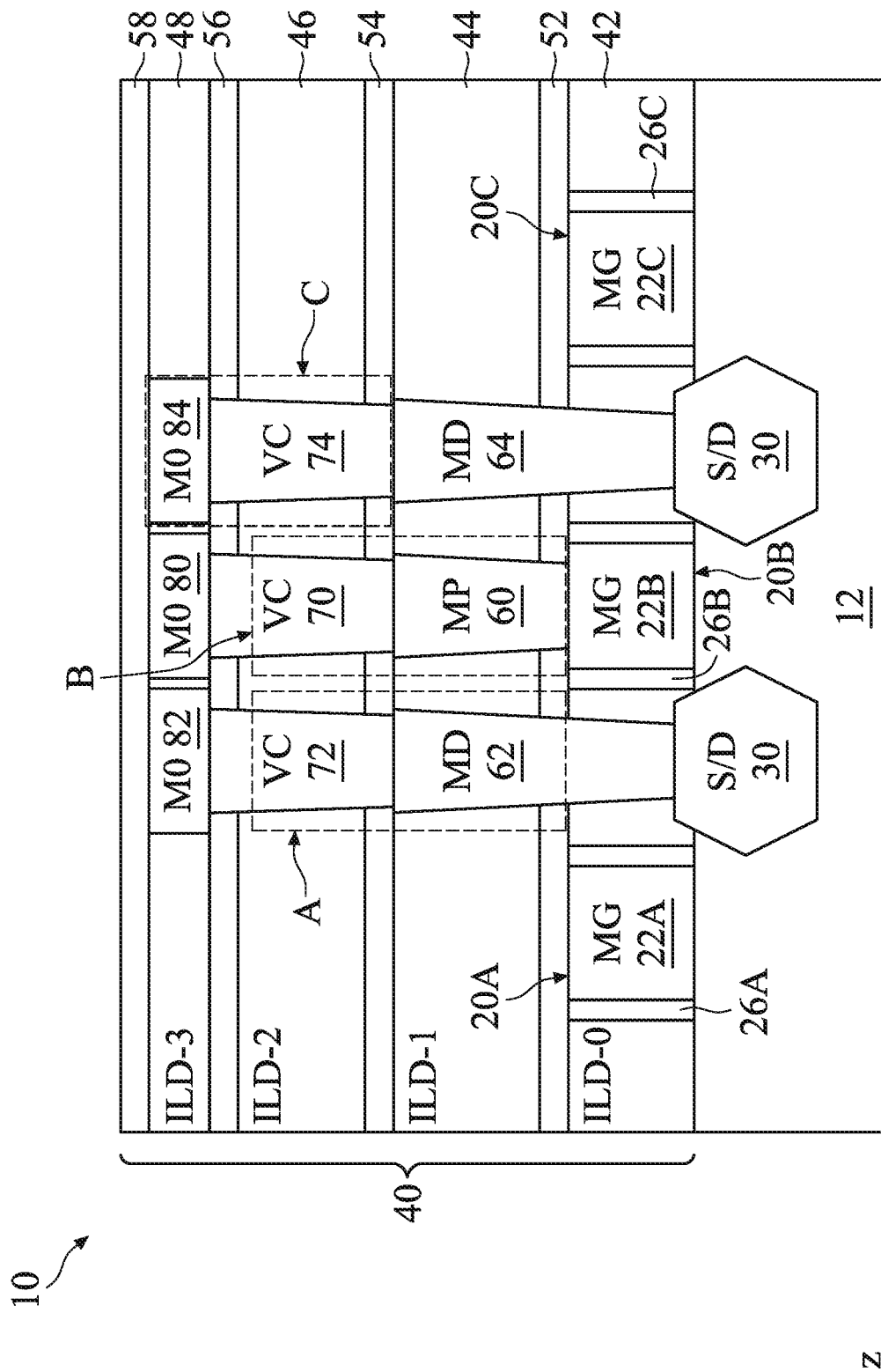
FIG. 1 is a cross-sectional diagrammatic view of an integrated circuit device, in portion or entirety, according to various aspects of the present disclosure.

The present disclosure relates generally to integrated circuit devices, and more particularly, to interconnect structures for integrated circuit devices.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes may include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating interconnect structures that interconnect IC features fabricated by FEOL processes (referred to herein as FEOL features or structures) and MEOL processes (referred to herein as MEOL features or structures), thereby enabling operation of the IC devices. For example, BEOL processes may include forming multilayer interconnect features that facilitate operation of the IC devices. The present disclosure explores methods of forming interconnect structures during BEOL processes for improved IC device performance.

FIG. 1 is a cross-sectional diagrammatic view of an integrated circuit (IC) device 10, in portion or entirety, according to various aspects of the present disclosure. IC device 10 may be included in a microprocessor, a memory, and/or other integrated circuit device. In some embodiments, IC device 10 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 1 has been simplified for the sake of clarity to better understand the inventive concepts of the present disclosure. Additional features may be added in IC device 10, and some of the features described below may be replaced, modified, or eliminated in other embodiments of IC device 10.

IC device 10 includes a substrate (e.g., a wafer) 12. In the depicted embodiment, substrate 12 includes silicon. Alternatively or additionally, substrate 12 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods. Substrate 12 may include various doped regions (not shown) depending on design requirements of IC device 10. In some embodiments, substrate 12 includes p-type doped regions (for example, p-type wells) doped with p-type dopants, such as boron (for example, $BF_2$), indium, other p-type dopant, or combinations thereof. In some embodiments, substrate 12 includes n-type doped regions (for example, n-type wells) doped with n-type dopants, such as phosphorus, arsenic, other n-type dopant, or combinations thereof. In some embodiments, substrate 12 includes doped regions formed with a combination of p-type dopants and n-type dopants. The various doped regions may be formed directly on and/or in substrate 12, for example, providing a p-well structure, an n-well structure, a dual-well structure, a raised structure, or combinations thereof. An ion implantation process, a diffusion process, other suitable doping process, or combinations thereof may be performed to form the various doped regions. In some embodiments, substrate 12 may be a three-dimensional fin structure (i.e., substrate 12 may be alternatively referred to as fin structure 12 and FIG. 1 illustrates a cross-sectional view of the fin structure 12 along a fin length) including one or more semiconductor materials and doped regions as described above.

An isolation feature(s) (not shown) is formed over and/or in substrate 12 to isolate various regions, such as various device regions, of IC device 10. For example, isolation features define and electrically isolate active device regions and/or passive device regions from each other. Isolation features include silicon oxide, silicon nitride, silicon oxynitride, other suitable isolation material, or combinations thereof. Isolation features may include different structures, such as shallow trench isolation (STI) structures, deep trench isolation (DTI) structures, and/or local oxidation of silicon (LOCOS) structures. In some embodiments, isolation features include STI features. For example, STI features may be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

Various gate structures are disposed over substrate 12, such as a gate structure 20A, a gate structure 20B, and a gate structure 20C. In some embodiments, one or more of gate structures 20A-20C interpose a source region and a drain region, where a channel region is defined between the source region and the drain region. The one or more gate structures 20A-20C engage the channel region, such that current may flow between the source/drain regions during operation. In some embodiments, gate structures 20A-20C are formed over a fin structure (e.g., the fin structure 12), such that gate structures 20A-20C each wrap a portion of the fin structure. For example, one or more of gate structures 20A-20C wrap channel regions of the fin structure, thereby interposing a source region and a drain region of the fin structure.

Gate structures 20A-20C include metal gate (MG) stacks, such as a metal gate stack 22A, a metal gate stack 22B, and a metal gate stack 22C. Metal gate stacks 22A-22C are configured to achieve desired functionality according to design requirements of IC device 10, such that metal gate stacks 22A-22C include the same or different layers and/or materials. In some embodiments, metal gate stacks 22A-22C include a gate dielectric (for example, a gate dielectric layer; not shown) and a gate electrode (for example, a work function layer and a conductive bulk layer; not shown). Metal gate stacks 22A-22C may include numerous other layers, for example, capping layers, interface layers, diffusion layers, barrier layers, hard mask layers, or combinations thereof. In some embodiments, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the gate dielectric layer is a high-k dielectric layer. The gate electrode includes a conductive material, such as aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the conductive bulk layer is a conductive layer formed over the work function layer. In some embodiments, the work function layer includes Ti, silver (Ag), manganese (Mn), zirconium (Zr), TaAl, TaAlC, TiAlN, TaC, TaCN, TaSiN, Mo, Al, ruthenium (Ru), TiN, TaN, WN, $ZrSi_2$, $MoSi_2$, $TaSi_2$, $NiSi_2$, other suitable work function materials, or combinations thereof. The bulk (or fill) conductive layer includes a suitable conductive material, such as Cu, Al, W, Co, Ru, other suitable conductive materials, or combinations thereof.

Gate structures 20A-20C are formed by deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atmospheric pressure CVD (APCVD), electroplating, other suitable methods, or combinations thereof. The lithography patterning processes include resist coating (for example, spin coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. Metal gate stacks 22A-22C are fabricated according to a gate-last process, a gate-first process, or a hybrid gate-last/gate-first process. In gate-last process implementations, gate structures 20A-20D include dummy gate stacks that are subsequently replaced with metal gate stacks 22A-22C. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which metal gate stacks 22A-22C are formed.

Gate structures 20A-20C further include spacers 26A-26C, which are disposed adjacent to (for example, along sidewalls of) metal gate stacks 22A-22C, respectively. Spacers 26A-26C are formed by any suitable process and include a dielectric material. The dielectric material may include silicon, oxygen, carbon, nitrogen, other suitable material, or combinations thereof (for example, silicon oxide, silicon nitride, silicon oxynitride, or silicon carbide). For example, in the depicted embodiment, a dielectric layer containing silicon and nitrogen, such as a silicon nitride layer, may be deposited over substrate 12 and subsequently anisotropically etched to form spacers 26A-26C. In some embodiments, spacers 26A-26C include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to metal gate stacks 22A-22C. In such implementations, the various sets of spacers may include materials having different etch rates. For example, a first dielectric layer containing silicon and oxygen (for example, silicon oxide) may be deposited over substrate 12 and subsequently anisotropically etched to form a first spacer set adjacent to metal gate stacks 22A-22C (or dummy metal gate stacks, in some embodiments), and a second dielectric layer including silicon and nitrogen (for example, silicon nitride) may be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 12 before and/or after forming spacers 26A-26C.

Epitaxial source features and epitaxial drain features (referred to as epitaxial source/drain features) are disposed in source/drain regions of substrate 12. For example, a semiconductor material is epitaxially grown on substrate 12, forming epitaxial source/drain features 30 over a source region and a drain region of substrate 12. In the depicted embodiment, gate structure 20B interposes epitaxial source/drain features 30, and a channel region is defined between epitaxial source/drain features 30. Gate structure 20B and epitaxial source/drain features 30 thus form a portion of a transistor, such as a pull-up transistor or a pull-down transistor of IC device 10. Gate structure 20B and/or epitaxial source/drain features 30 are thus alternatively referred to as device features. In some embodiments, epitaxial source/drain features 30 wrap source/drain regions of a fin structure. An epitaxy process may implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process may use gaseous and/or liquid precursors, which interact with the composition of substrate 12. Epitaxial source/drain features 30 are doped with n-type dopants and/or p-type dopants. In some embodiments, where IC device 10 is configured as an n-type device (for example, having an n-channel), epitaxial source/drain features 30 are epitaxial layers containing silicon and/or carbon, where silicon-containing epitaxial layers or silicon-carbon-containing epitaxial layers are doped with phosphorous, other n-type dopant, or combinations thereof (for example, forming a Si:P epitaxial layer or a Si:C:P epitaxial layer). In some embodiments, where IC device 10 is configured as a p-type device (for example, having a p-channel), epitaxial source/drain features 30 are epitaxial layers containing silicon and germanium, where the silicon-germanium-containing epitaxial layers are doped with boron, other p-type dopant, or combinations thereof (for example, forming a Si:Ge:B epitaxial layer). In some embodiments, epitaxial source/drain features 30 include materials and/or dopants that achieve desired tensile stress and/or compressive stress in the channel region. In some embodiments, epitaxial source/drain features 30 are doped during deposition by adding impurities to a source material of the epitaxy process. In some embodiments, epitaxial source/drain features 30 are doped by an ion implantation process subsequent to a deposition process. In some embodiments, annealing processes are performed to activate dopants in epitaxial source/drain features 30 and/or other source/drain regions of IC device 10 (for example, HDD regions and/or LDD regions).

A multilayer interconnect (MLI) feature 40 is disposed over substrate 12. MLI feature 40 electrically couples various devices (for example, transistors, resistors, capacitors, and/or inductors) and/or components (for example, gate structures and/or source/drain features) of IC device 10, such that the various devices and/or components may operate as specified by design requirements of integrated circuit device 10. MLI feature 40 includes a combination of dielectric layers and conductive layers configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 40. During operation of IC device 10, the interconnect structures are configured to route signals between the devices and/or the components of IC device 10 and/or distribute signals (for example, clock signals, voltage signals, and/or ground signals) to the devices and/or the components of IC device 10. It is noted that though MLI feature 40 is depicted with a given number of dielectric layers and conductive layers, the present disclosure contemplates MLI feature 40 having more or less dielectric layers and/or conductive layers depending on design requirements of IC device 10.

In FIG. 1, MLI feature 40 includes one or more dielectric layers, such as an interlayer dielectric layer 42 (ILD-0) disposed over substrate 12, an interlayer dielectric layer 44 (ILD-1) disposed over ILD layer 42, an interlayer dielectric layer 46 (ILD-2) disposed over ILD layer 44, and an interlayer dielectric layer 48 (ILD-3) disposed over ILD layer 46. In some embodiments, ILD layers 44, 46, and 48 are alternatively referred to as inter-metal dielectric (IMD) layers. ILD layers 42-48 include a dielectric material such as silicon oxide, silicon nitride, silicon oxynitride, silicon oxycarbide, silicon oxycarbonitride, tetraethyl orthosilicate (TEOS), un-doped silicate glass, or doped silicon oxide such as borophosphosilicate glass (BPSG), phosphosilicate glass (PSG), boron-doped silicon glass (BSG), a low-k dielectric material, an extreme low-k dielectric material, other suitable dielectric materials, or combinations thereof. Examples low-k or extreme low-k dielectric materials include fluorine-, carbon-, and/or $CH_3$-doped silicon oxide, porous silicon oxide-based materials, amorphous carbon, silsesquioxane-based dielectric materials, Black Diamond® (Applied Materials of Santa Clara, Calif.), Xerogel, Aerogel, Parylene, SiLK (Dow Chemical, Midland, Mich.), polyimide, other suitable dielectric materials, or combinations thereof. In the depicted embodiment, ILD layers 42-48 are dielectric layers that include a low-k dielectric material (generally referred to as low-k dielectric layers). ILD layers 42-48 may include a multilayer structure having multiple dielectric materials.

MLI feature 40 may further include one or more etch stop layers (ESL) disposed over substrate 12, such as an ESL 52 disposed between ILD layer 42 and ILD layer 44, an ESL 54 disposed between ILD layer 44 and ILD layer 46, an ESL 56 disposed between ILD layer 46 and ILD layer 48, and an ESL 58 disposed over ILD layer 48. In some embodiments, an ESL (not shown) is also disposed between substrate 12 and ILD layer 42. ESLs 52-58 contain a material different than ILD layers 42-48, such as a dielectric material that is different from the dielectric material of ILD layers 42-48. In the depicted embodiment, where ILD layers 42-48 include a low-k dielectric material, ESLs 52-58 include silicon and nitrogen (for example, silicon nitride or silicon oxynitride). In some embodiments, ESLs 52-58 may include silicon carbide, silicon oxide, silicon oxycarbide, silicon carbonitride, silicon oxynitride, silicon oxycarbonitride, aluminum oxynitride, aluminum oxide, other suitable materials, or combinations thereof.

ILD layers 42-48 and/or ESLs 52-58 are formed over substrate 12, for example, by a deposition process, such as CVD, PVD, ALD, PECVD, HDPCVD, MOCVD, RPCVD, LPCVD, ALCVD, APCVD, thermal oxidation, spin-on dielectric, plating, other suitable methods, or combinations thereof. In some embodiments, ILD layers 42-48 and/or ESLs 52-58 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 42-48 and/or ESLs 52-58, a CMP process and/or other planarization process is performed, such that ILD layers 42-48 and/or ESLs 52-58 have substantially planar surfaces.

A device-level contact 60, a device-level contact 62, a device-level contact 64, a via 70, a via 72, a via 74, a conductive line 80, a conductive line 82, and a conductive line 84 are disposed in ILD layers 42-48 to form interconnect structures. Device-level contacts 60-64 (also referred to as local interconnects or local contacts) electrically couple and/or physically couple IC device features (e.g., epitaxial source/drain features 30 and/or metal gate stacks 22A-22C) to other conductive features of MLI feature 40. For example, device-level contact 60 is a metal-to-poly (MP) contact, which generally refers to a contact to a gate structure, such as a poly gate structure or a metal gate structure. In the depicted embodiment, device-level contact 60 is disposed on gate structure 20B (in particular, metal gate stack 22B), such that device-level contact 60 connects gate structure 20B to via 70. Device-level contact 60 extends through ILD layer 44 and ESL 52, though the present disclosure contemplates embodiments where device-level contact 60 extends through more than one ILD layer and/or ESL of MLI feature 40. In furtherance of the example, device-level contact 62 and device-level contact 64 are metal-to-device (MD) contacts, which generally refer to contacts to a conductive region of IC device 10, such as source/drain regions. In the depicted embodiment, device-level contact 62 and device-level contact 64 are disposed on respective epitaxial source/drain features 30, such that device-level contact 62 and device-level contact 64 connect epitaxial source/drain features 30 respectively to via 72 and via 74. Device-level contact 62 and device-level contact 64 extend through ILD layer 42, ILD layer 44, and ESL 52, though the present disclosure contemplates embodiments where device-level contact 62 and/or device-level contact 64 extend through more than one ILD layer and/or ESL of MLI feature 40. In some embodiments, device-level contacts 60-64 are MEOL conductive features that interconnect FEOL conductive features (for example, gate structures 20A-20C and/or epitaxial source/drain features 30) to BEOL conductive features (for example, vias 70-74), thereby electrically and/or physically coupling FEOL conductive features to BEOL conductive features.

Vias 70-74 electrically couple and/or physically couple conductive features of MLI feature 40 to one another. For example, via 70 is disposed on device-level contact 60, such that via 70 connects device-level contact 60 to conductive line 80; via 72 is disposed on device-level contact 62, such that via 72 connects device-level contact 62 to conductive line 82; and via 74 is disposed on device-level contact 64, such that via 74 connects device-level contact 64 to conductive line 84. Of course, additional vias and/or conductive lines may be formed over IC device 10 than depicted herein. In some embodiments, vias 70-74 are BEOL conductive features that interconnect MEOL conductive features (for example, device-level contacts 60-64) to BEOL conductive features (for example, conductive lines 80-84), thereby electrically and/or physically coupling MEOL conductive features to BEOL conductive features. Device-level contacts 60-64, vias 70-74, and conductive lines 80-84 include any suitable conductive material, such as Co, Ru, Cu, Ta, Ti, Ir, W, Al, TaN, TiN, other suitable conductive materials, or combinations thereof.

With respect to fabricating interconnect structures in semiconductor devices, one process generally implemented to form an upper conductive feature (e.g., a via, a conductive line, etc.) over multiple lower conductive features (e.g., a via, a conductive line, a device-level contact, etc.) includes depositing a dielectric layer (e.g., an ILD layer) over the lower conductive features; performing one or more patterning processes (e.g., including lithography and/or etching processes) to form an opening (e.g., a trench or a hole) in the dielectric layer that exposes at least one of the lower conductive features; filling the opening with a conductive material; and performing a CMP process to planarize a top surface of the upper conductive feature.

In many instances, the performance and reliability of the overall devices depend upon the precision with which interconnect structures are formed. For example, reliability concerns such as time-dependent dielectric breakdown (TDDB) and voltage breakdown (VBD) often arise when two adjacent conductive features are inadvertently formed too close to each other as a result of misalignment during the patterning process, potentially causing shorting issues within the device. Specific to some embodiments discussed in the present disclosure, when patterning misalignment (i.e., overlay errors during the patterning process) occurs, portions of a lower dielectric layer disposed between two adjacent lower conductive features are inadvertently removed during the etching process that forms the opening. When a conductive material is then deposited in the opening to form the upper conductive feature, a portion of the upper conductive feature extends to contact one of the lower conductive features over which it is formed, effectively "widening" that lower conductive feature (i.e., enlarging its lateral dimension) and reducing a separation distance between the two adjacent lower conductive features. To address these challenges, IC manufacturers are seeking to improve methods of forming interconnect features to minimize reliability concerns such as TDDB as discussed above. For example, embodiments of the present disclosure are directed to methods of mitigating effects of overlay errors by providing measures to at least minimize etching of the lower dielectric layer, thereby ensuring that the adjacent lower conductive features are properly insulated under designated operating conditions.

Referring back to FIG. 1, embodiments of the present disclosure may be applicable, though not limited, to Portion A, Portion B, and/or Portion C of IC device 10. In other words, the present embodiments of method 100 depicted in FIG. 2 may be directed to forming via 72 over device-level contact 62, forming via 70 over device-level contact 60, and/or forming conductive line 84 over via 74. As such, embodiments of method 100 are discussed in reference to an interconnect structure 200 depicted in FIGS. 3A-11C, where interconnect structure 200 may reflect Portion A, Portion B, or Portion C of IC device 10 as shown in FIG. 1. Additional steps may be provided before, during, and after method 100, and some of the steps described may be moved, replaced, or eliminated for additional embodiments of method 100. FIGS. 3A-12B have been simplified for the sake of clarity to better understand the inventive concepts of the present disclosure. Additional features may be added in interconnect structure 200, and some of the features described below may be replaced, modified, or eliminated in other embodiments of interconnect structure 200.

Figure 2:
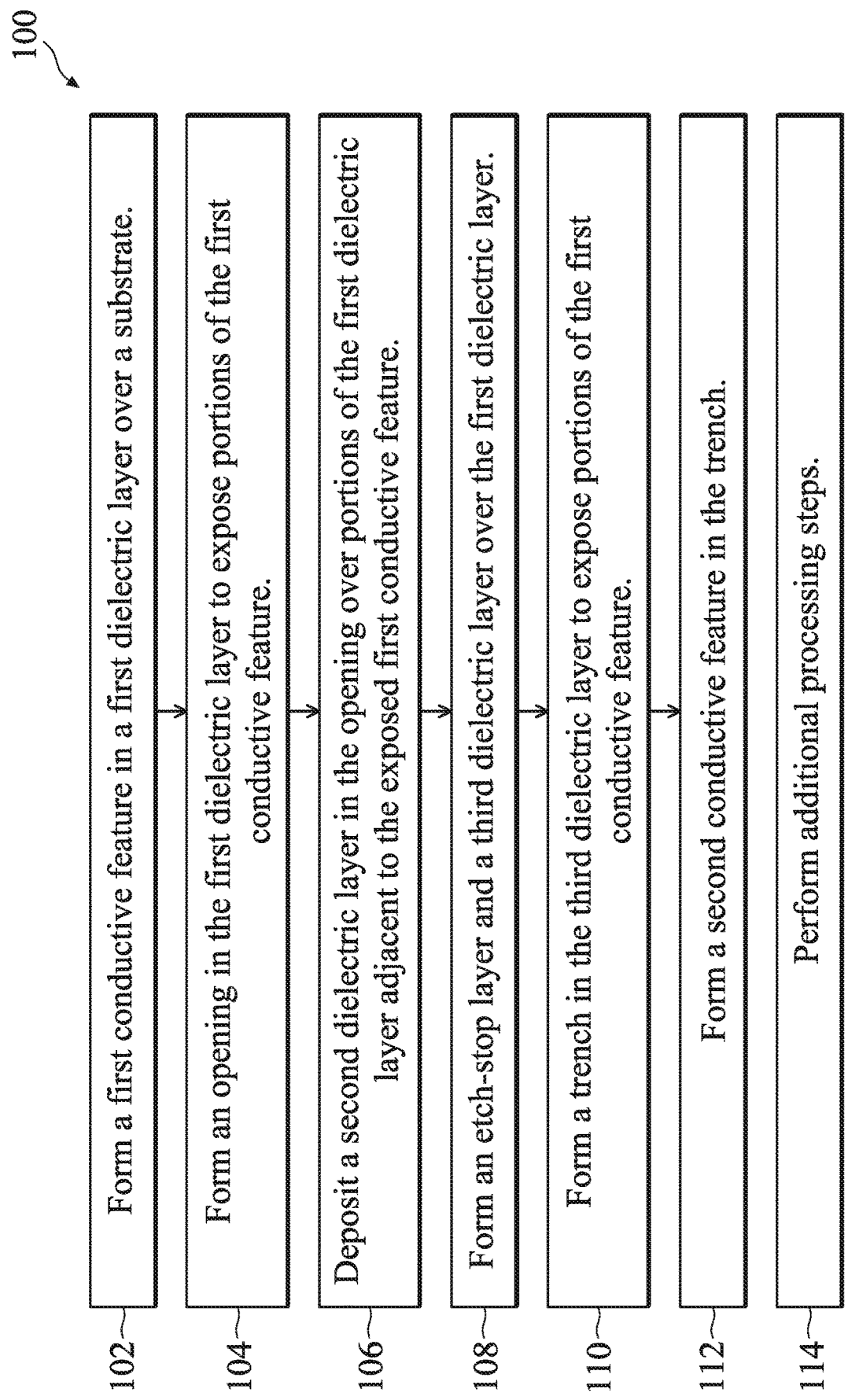
FIG. 2 is a flow chart of a method for fabricating an interconnect structure, such as the interconnect structures depicted in FIG. 1 and/or FIGS. 3A-12B, according to various aspects of the present disclosure.
Figure 3A:
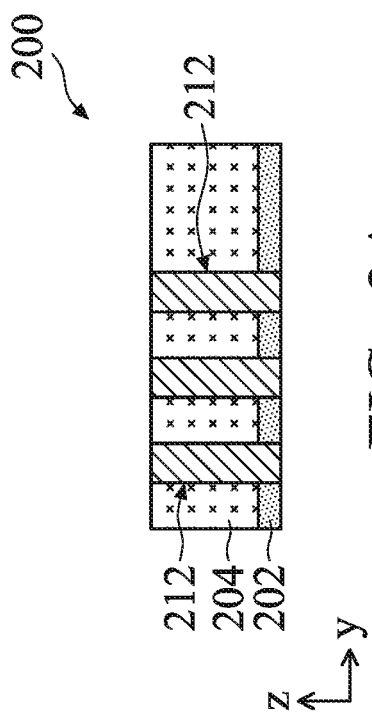
Figure 3B:
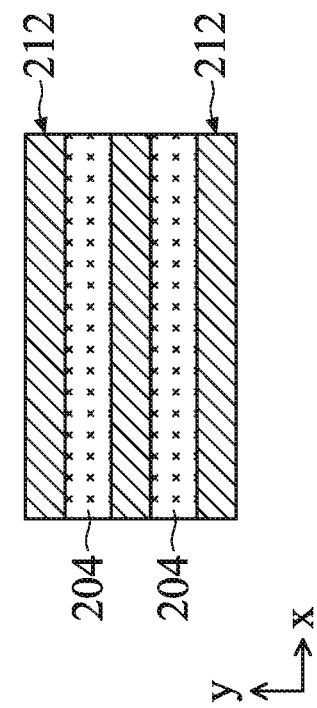
FIGS. 3B and 12B are planar top views of an interconnect structure, in portion or entirety, at various fabrication stages (such as those associated with the method of FIG. 2) according to various aspects of the present disclosure.

Referring to FIGS. 2, 3A, and 3B, method 100 at operation 102 forms a conductive feature 212 in a dielectric layer 204 and over an ESL 202. In some embodiments, conductive feature 212 is similar to any of device-level contacts 60-64, vias 70-74, or conductive lines 80-84 as discussed above with reference to FIG. 1. In some embodiments, conductive feature 212 extends through dielectric layer 204 and ESL 202 to interconnect additional conductive features formed below ESL 202 to those formed above dielectric layer 204. In some embodiments, ESL 202 is omitted from interconnect structure 200. In one example, conductive feature 212 may be a device-level contact similar to device-level contacts 62 and 60 and configured to interconnect FEOL features (e.g., metal gate stack 22B or epitaxial source/drain features 30) to BEOL features (e.g., vias 70 or 72). In another example, conductive feature 212 may be similar to via 74 and configured to interconnect MEOL features (e.g., device-level contact 64) to additional BEOL features (e.g., conductive line 84).

ESL 202 is similar to any ESL 52-58 and may include, for example, silicon carbide, silicon oxide, silicon oxycarbide, silicon nitride, silicon carbonitride, silicon oxynitride, silicon oxycarbonitride, aluminum oxynitride, aluminum oxide, other suitable materials, or combinations thereof. ESL 202 may be formed by any deposition process such as PVD, CVD, FCVD, ALD, spin coating, other suitable process, or combinations thereof. In some embodiments, ESL 202 may be formed to a thickness of about 10 angstroms to about 200 angstroms. In some embodiments, a deposition process for forming ESL 202 implements a temperature of about 150 degrees Celsius to about 400 degrees Celsius. Dielectric layer 204 is similar to any of ILD layers 44-48 and may include, for example, silicon oxide, silicon nitride, silicon oxynitride, silicon oxycarbide, silicon oxycarbonitride, TEOS, un-doped silicate glass, or doped silicon oxide such as BPSG, PSG, BSG, a low-k dielectric material, an extreme low-k dielectric material, other suitable dielectric materials, or combinations thereof. In one embodiment, dielectric layer 204 includes a low-k dielectric material (i.e., having a dielectric constant less than that of silicon oxide) and/or an extreme low-k dielectric material, such as fluorine-, carbon-, and/or $CH_3$-doped silicon oxide, porous silicon oxide-based materials, amorphous carbon, silsesquioxane-based dielectric materials, Black Diamond® (Applied Materials of Santa Clara, Calif.), Xerogel, Aerogel, Parylene, SiLK (Dow Chemical, Midland, Mich.), polyimide, other suitable low-k or extreme low-k dielectric materials, or combinations thereof. Dielectric layer 204 may be formed by any deposition process such as PVD, CVD, FCVD, ALD, spin coating, other suitable process, or combinations thereof. In some embodiments, dielectric layer 204 may be formed to a thickness of about 30 angstroms to about 800 angstroms by a deposition process that implements a temperature of about 150 degrees Celsius to about 400 degrees Celsius. Of course, other deposition conditions for forming ESL 202 and dielectric layer 204 may also be applicable according to some embodiments of the present disclosure.

In some embodiments, conductive feature 212 includes any suitable conductive material, such as Co, Ru, Cu, W, Ta, Ti, Al, Mo, Ir, TaN, TiN, other suitable conductive materials, or combinations thereof, and has a thickness of about 10 angstroms to about 1000 angstroms. In some embodiments, conductive feature 212 may be fabricated by patterning dielectric layer 204 and ESL 202 to form an opening and subsequently depositing a suitable conductive material in the opening by a deposition process such as PVD, CVD, plating, other suitable methods, or combinations thereof. In some embodiments, the deposition process may be implemented at a temperature of about 150 degrees Celsius to about 400 degrees Celsius. The patterning process includes lithography processes and/or etching processes. For example, forming the opening in dielectric layer 204 includes performing a lithography process to form a patterned resist layer over dielectric layer 204 and performing an etching process to transfer a pattern defined in the patterned resist layer to dielectric layer 204. The lithography process may include forming a resist layer on dielectric layer 204 (for example, by spin coating), performing a pre-exposure baking process, performing an exposure process using a lithography mask, performing a post-exposure baking process, and performing a developing process. The exposure process may be implemented using radiation energy such as ultraviolet (UV) light, deep UV (DUV) light, or extreme UV (EUV) light. After development, the patterned resist layer includes a resist pattern that corresponds with the mask. The etching process uses the patterned resist layer as an etch mask to remove portions of dielectric layer 204. The etching process may include a dry etching process (for example, a reactive ion etching (RIE) process), a wet etching process, other suitable etching process, or combinations thereof. After the etching process, the patterned resist layer is removed from dielectric layer 204, for example, by a resist stripping process. Alternatively, the exposure process may be implemented or replaced by other methods, such as maskless lithography, electron-beam (e-beam) writing, ion-beam writing, and/or nanoimprint technology. Though not depicted, in some embodiments, conductive feature 212 may further include other material layers, such as barrier layers, capping layers, adhesion layers, other suitable material layers, or combinations thereof. For example, a barrier layer may be disposed between dielectric layer 204 (and ESL 202) and the conductive material used to form conductive feature 212.

Figure 4:
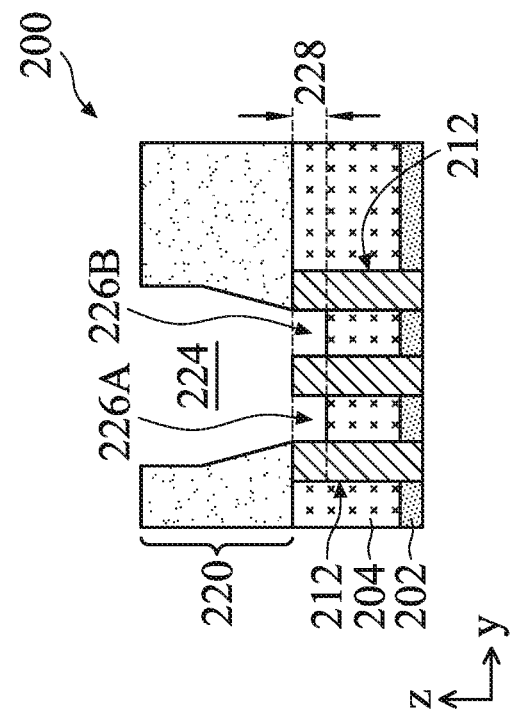

Referring to FIGS. 2 and 4, method 100 at operation 104 forms openings 226A and 226B in dielectric layer 204. In some embodiments, a masking element 220 that includes one or more material layers is implemented to facilitate the patterning process at operation 104. Masking element 220 may be deposited over dielectric layer 204 and may be a multi-layer material that includes at least a resist layer (e.g., a photoresist layer) optionally disposed over a hard mask, a bottom layer (e.g., bottom anti-reflective coating), other suitable layers, or combinations thereof. A patterning process (including lithography and/or etching processes) similar to that discussed above with respect to forming conductive feature 212 may be applied at operation 104 to form an opening 224 in masking element 220. Briefly, the resist layer in masking element 220 may be patterned by a series of exposure and development processes (and optionally any post-exposure baking processes) and subsequently used as an etching mask for forming opening 224. Opening 224 subsequently exposes portions of dielectric layer 204 and conductive feature 212. As depicted herein, the patterning process at operation 104 selectively removes (e.g., by etching) portions of dielectric layer 204 to form openings 226A and 226B without etching or substantially etching portions of conductive feature 212 exposed in opening 224. Stated differently, the patterning process at operation 104 exposes a top surface and portions of sidewall surfaces of conductive feature 212. This selective etching process may be a dry etching process, a wet etching process, an RIE, other suitable etching processes, or combinations thereof. In the present embodiment, the selectively etching process is an isotropic dry etching process utilizing a plasma etchant including a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, an oxygen-containing gas (e.g., $O_2$), a nitrogen-containing gas (e.g., $N_2$), a helium-containing gas, an-argon containing gas, a neon-containing gas, other suitable gases, or combinations thereof. In the present embodiment, a fluorine-containing gas is used to selectively etch dielectric layer 204 with respect to conductive feature 212. In some embodiments, the selective etching process at operation 104 is controlled by tuning the duration of the etching process such that a depth 228 of openings 226A and 226B is kept within a desired range according to any specific design requirements.

In the present disclosure, method 100 at operation 104 may functionalize exposed surfaces of conductive feature 212 after forming openings 226A and 226B. In some embodiments, functionalizing the exposed surfaces of conductive feature 212 includes forming a self-assembled monolayer (SAM) over portions of conductive feature 212 exposed by opening 224 and openings 226A and 226B. The SAM may be configured to inhibit subsequent deposition of a dielectric material (e.g., dielectric layer or dielectric feature 230 discussed below) over conductive feature 212. In some embodiments, the SAM may include a sulfur-containing functional group (e.g., thiols), a silicon-containing group (e.g., silanes), an oxygen-containing group (e.g., hydroxyls), a methyl-containing group, or combinations thereof. The SAM may be formed by any suitable deposition process such as, for example, spread coating, chemisorption, PVD, electrodeposition, micro-contact printing, other suitable processes, or combinations thereof.

Referring to FIGS. 2 and 5A, method 100 at operation 106 deposits a dielectric layer (alternatively referred to as dielectric feature) 230 in openings 226A and 226B. In some embodiments, dielectric layer 230 is selectively deposited in openings 226A and 226B and is not formed or substantially formed over the top surface of conductive feature 212 and over a top surface of masking element 220. Dielectric layer 230 has a composition different from that of dielectric layer 204 and a subsequently deposited ESL (for example, ESL 242 of FIG. 7) to achieve substantial etching selectivity. Notably, dielectric layer 230 has an etching selectivity of at least about 20 relative to dielectric layer 204. Additionally, dielectric layer 230 has an etching selectivity of at least about 10 relative to ESL 242. In other words, for a given etchant, an etching rate of dielectric layer 230 differs from that of dielectric layer 204 by at least 20 folds and from that of ESL 242 by at least 10 folds. In the present embodiment, an etching rate of dielectric layer 230 is lower than an etching rate of dielectric layer 204, such that at least portions of dielectric layer 204 surrounding conductive feature 212 may be protected during subsequent etching processes.

In some embodiments, dielectric layer 230 may include an oxide material or an oxynitride material including a metallic element such as hafnium, lithium, niobium, nickel, magnesium, manganese, molybdenum, tin, strontium, tantalum, titanium, tungsten, zinc, zirconium, other suitable metallic element, or combinations thereof. In further examples, dielectric layer 230 may include silicon in the forms of, for example, silicon oxide, silicon oxycarbide, silicon oxycarbonitride, silicon oxynitride, silicon carbide, other suitable materials, or combinations thereof. In some embodiments, dielectric layer 230 includes a metal oxide having a metallic element as discussed above. In some embodiments, dielectric layer 230 is free of silicon. Dielectric layer 230 may be formed by any suitable method such as PVD, CVD, ALD, spin coating, other suitable methods, or combinations thereof. Notably, because dielectric layer 230 generally employs a dielectric material having a higher capacitance than a dielectric material of dielectric layer 204, in order to minimize the capacitance between the conductive features 212 while increasing the etching selectivity between dielectric layers 230 and 204, the present disclosure contemplates embodiments in which the thickness of dielectric layer 230 is less than the thickness of dielectric layer 204. In some embodiments, dielectric layer 230 has a thickness of about 5 angstroms to about 100 angstroms. In some embodiments, dielectric layer 230 has a thickness of about 10 angstroms to about 80 angstroms. Of course, the present disclosure is not limited to such dimensions so long as the thickness of dielectric layer 230 is less than a thickness 229 of dielectric layer 204. In some embodiments, dielectric layer 230 may be deposited at a temperature of about 150 degrees Celsius to about 400 degrees Celsius. Of course, other deposition conditions may also be applicable according to some embodiments of the present disclosure.

Dielectric layer 230 is selectively formed over dielectric layer 204 and not (or substantially not) over masking element 220 and conductive feature 212. The deposition of dielectric layer 230 may be controlled by time such that the process would terminate once material saturation is reached. In some embodiments, as depicted in FIG. 5A, a top surface of dielectric layer 230 is substantially planar with the top surface of conductive feature 212, such that a thickness of dielectric layer 230 is substantially equal to depth 228 of opening 226A and opening 226B. However, as depicted in an enlarged portion D of interconnect structure 200, it is also possible in some instances that a top surface of dielectric layer 230 has a convex profile (see FIG. 5B) or concave profile (see FIG. 5C) with respect to the top surface of conductive feature 212. A configuration of the top surface of dielectric layer 230 may be determined by a specific material utilized for forming dielectric layer 230. In some embodiments, the thickness (i.e., depth 228) of dielectric layer 230 is less than a thickness 229 of dielectric layer 204 (see FIG. 5A).

Referring to FIG. 6, after forming dielectric layer 230, method 100 at operation 106 removes masking element 220 with a wet etching, resist stripping, and/or a plasma ashing process. In some embodiments, masking element 220 is selectively removed without removing or substantially removing any of dielectric layer 230, conductive feature 212, dielectric layer 204, or any other layers disposed below masking element 220.

Referring to FIGS. 2 and 7, method 100 at operation 108 forms a dielectric layer 244 over dielectric layer 204. In some embodiments, as depicted herein, an ESL 242 is formed over dielectric layer 204 and interposes dielectric layer 204 and dielectric layer 244. In some embodiments, dielectric layer 244 is similar to dielectric layer 204 and may include, for example, silicon carbide, silicon oxide, silicon oxycarbide, silicon nitride, silicon carbonitride, silicon oxynitride, silicon oxycarbonitride, other suitable materials, or combinations thereof. In some embodiments, ESL 242 is similar to ESL 202 and may include, for example, silicon carbide, silicon oxide, silicon oxycarbide, silicon nitride, silicon carbonitride, silicon oxynitride, silicon oxycarbonitride, aluminum oxynitride, aluminum oxide, other suitable materials, or combinations thereof. Dielectric layer 244 and ESL 242 may be formed by any deposition process such as CVD, FCVD, ALD, thermal oxidation, other suitable process, or combinations thereof.

Figure 8A:
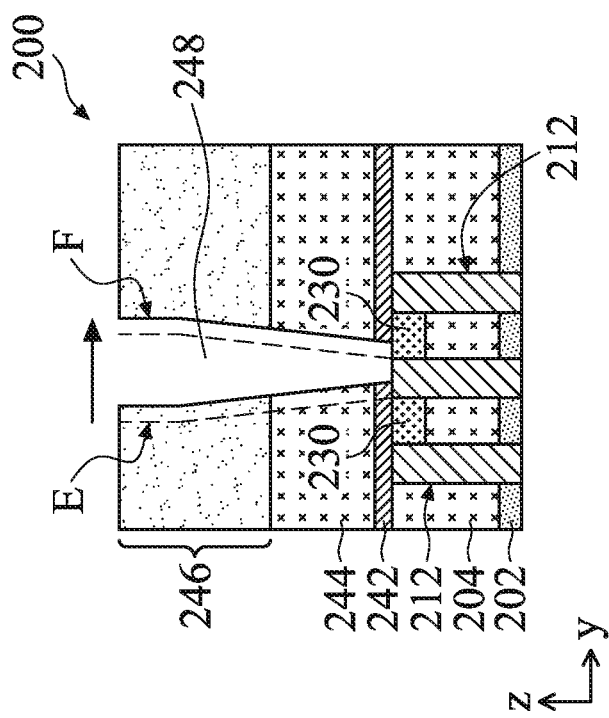
Figure 8B:
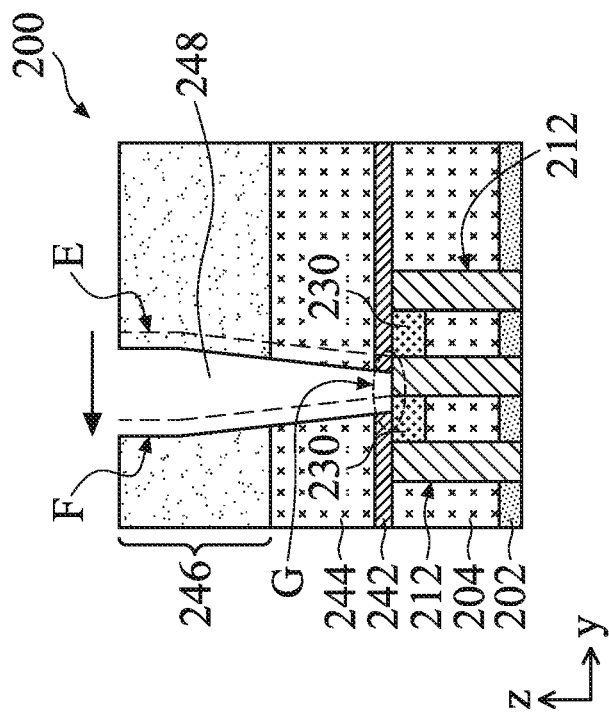

Referring to FIGS. 2, 8A, and 8B, method 100 at operation 110 patterns dielectric layer 244 (and ESL 242 if present) by forming a trench 248 in dielectric layer 244. In the present embodiment, trench 248 extends through dielectric layer 244 and ESL 242 to expose at least a portion of conductive feature 212. Similar to the patterning process implemented at operation 104, a masking element 246 is formed over dielectric layer 244 and subsequently patterned to form an etch mask over dielectric layer 244. Thereafter, an etching process may be implemented to form trench 248 in dielectric layer 244 and ESL 242 using the patterned masking element 246 as an etch mask. The first step of the two-step etching process is configured to remove a portion of dielectric layer 244, and the second step of the two-step etching process is configured to remove a portion of ESL 242. In certain embodiments, the second etching process removes a top portion of dielectric layer 230. In some embodiments, the first and the second etching steps differ in various etching parameters (e.g., pressure, power, bias, and/or temperature) they employ. In addition, because dielectric layer 244 and ESL 242 differ in their compositions, the rates at which these two layers are removed by the etching process are also different. In some embodiments, each of the two steps includes an isotropic dry etching process that utilizes a plasma etchant such as a fluorine-containing gas (e.g., $CF_4$, $SF_6$, $CH_2F_2$, $CHF_3$, $CH_3F$, $C_4F_6$, $C_4F_8$ and/or $C_2F_6$), a chlorine-containing gas (e.g., $C_{12}$, $CHCl_3$, $CCl_4$, and/or $BCl_3$), a bromine-containing gas (e.g., HBr and/or $CHBr_3$), a hydrogen-containing gas (e.g., $CH_4$ and/or $H_2$), a carbon-containing gas (e.g., CO and/or $CO_2$) an oxygen-containing gas (e.g., $O_2$), a nitrogen-containing gas (e.g., $N_2$), a helium-containing gas, an argon-containing gas, a neon-containing gas, other suitable gases, or combinations thereof. In some embodiments, the two steps of etching employ the same plasma etchant(s). The plasma etchant may be implemented using any suitable method such as inductively couple plasma (ICP), capacitively coupled plasma (CCP), remote plasma, other suitable methods, or combinations thereof. In example embodiments, the etching process may be implemented at a pressure of about 0.2 mT to about 100 mT, at a temperature of about 0 degree Celsius to about 100 degrees Celsius, at a power of about 50 W to about 2000 W, and a bias of about 0 to 800 V. Thereafter, the patterned masking element 246 is removed from interconnect structure 200 by any suitable method such as wet etching, resist stripping, and/or plasma ashing.

In some embodiments, trench 248 is defined by a profile E (depicted in dotted line) such that the opening of trench 248 is centered above to expose a top surface of conductive feature 212. In some embodiments, however, as depicted in FIGS. 8A and 8B, misalignment of lithography mask (e.g., overlay errors) during the patterning processes at operation 110 could cause lateral shifts of the pattern formed in dielectric layer 244, resulting in an offset between profile F (depicted in solid line), which is the actual profile of the resulting trench 248, and profile E. For embodiments in which such shift occurs, dielectric layer 230 would also be exposed to the etching processes at operation 110.

Figure 8C:
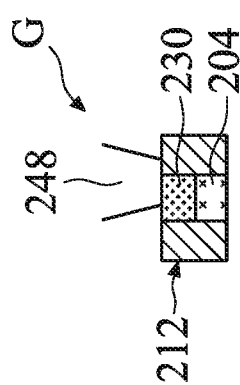
Figure 8D:
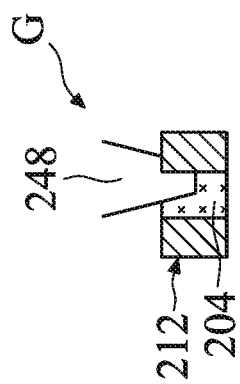

To further illustrate the effect of overlay errors on the formation of trench 248, FIG. 8C illustrates the structure of portion G as depicted in FIG. 8A in an embodiment where dielectric layer 230 is not included. In the absence of dielectric layer 230, a shift in trench 248 from its intended position exposes a portion of dielectric layer 204 to the etching processes at operation 110, subsequently removing that portion of dielectric layer 204. Referring to FIG. 8D, however, the inclusion of dielectric layer 230 over dielectric layer 204 substantially prevents trench 248 from extending downward to expose a portion of dielectric layer 204 such that a bottom surface of trench 248 is defined by dielectric layer 230 instead of dielectric layer 204 as depicted in FIG. 8C. This is due to the fact that, as discussed above, dielectric layer 230 exhibits significant etching selectivity with respect to dielectric layer 204 such that dielectric layer 230 may be etched at a much slower rate than dielectric layer 204. In one embodiment, when using the same etchant, an etching rate of dielectric layer 230 may be at most about 1/20 of that of dielectric layer 204.

Referring to FIGS. 2, 9, and 10, method 100 at operation 112 forms a conductive feature 252 in trench 248. In some embodiments, conductive feature 252 is similar to any of vias 70-74 or conductive lines 80-84 as discussed above with reference to FIG. 1. For example, if conductive feature 212 corresponds to one of device-level contacts 60-64, then conductive feature 252 corresponds to one of vias 70-74 disposed thereover. In some embodiments, conductive feature 252 extends through dielectric layer 244 (and ESL 242) to contact at least portions of conductive feature 212 exposed by trench 248. In some embodiments, a bottom surface of conductive feature 252 is defined by a portion of conductive feature 212. In some embodiments, as depicted in FIG. 10, a bottom surface of conductive feature 252 is defined by portions of both conductive feature 212 and dielectric layer 230, which is an indication that an overlay error may have occurred. Accordingly, rather than landing on dielectric layer 204 as a result of misalignment during the patterning process, the presence of dielectric layer 230 facilitates the landing of conductive feature 252 to align with conductive feature 212 and dielectric layer 230.

Method 100 at operation 112 forms conductive feature 252 by first depositing a conductive material 250 in trench 248 and over a top surface of dielectric layer 244 as shown in FIG. 9. In some embodiments, conductive material 250 includes Co, Ru, Cu, W, Ta, Ti, Al, Mo, Ir, TaN, TiN, other suitable conductive materials, or combinations thereof. In some embodiments, conductive material 250 has a thickness of about 10 angstroms to about 1000 angstroms. In some embodiments, conductive material 250 may be deposited by any suitable method such as PVD, CVD, ALD, plating, other suitable methods, or combinations thereof. In some embodiments, the deposition process may be implemented at a temperature of about 150 degrees Celsius to about 400 degrees Celsius. Though not depicted, in some embodiments, conductive feature 252 may further include other material layers, such as barrier layers, capping layers, adhesion layers, other suitable material layers, or combinations thereof. For example, a barrier layer may be formed conformally in trench 248 before depositing conductive material 250 thereon. Thereafter, referring to FIG. 10, method 100 performs one or more planarization process (e.g., a CMP process) to remove portions of conductive material 250 formed over the top surface of dielectric material 244, thereby forming conductive feature 252. In example embodiments, neighboring conductive features 252 (only one is depicted herein) has a separation distance (i.e., critical dimension) of about 5 nm to about 50 nm with a profile angle (i.e., an angle between a sidewall of conductive feature 252 and the z axis as depicted herein) of about 40 degrees to about 90 degrees.

Notably, comparing FIG. 10 to FIG. 11, because the bottom surface of conductive feature 252 stops on dielectric layer 230 instead of dielectric layer 204, a separation distance 262 between adjacent conductive features (here, adjacent conductive features 212) of FIG. 10 is greater than a separation distance 264 between adjacent conductive features (here, conductive feature 212 and conductive feature 252) of FIG. 11. In other words, in the absence of dielectric layer 230, conductive feature 252 extends into dielectric layer 204 (for example, below a top surface of dielectric layer 204 and below a top surface of conductive features 212), thereby reducing separation distance 264 and potentially triggering the occurrence of TDDB over time in interconnect structure 200. Accordingly, present embodiments provide methods of forming self-aligned conductive features to mitigate effects of overlay errors and to improve reliability of interconnect structure 200 (thus device 10).

Figure 12B:
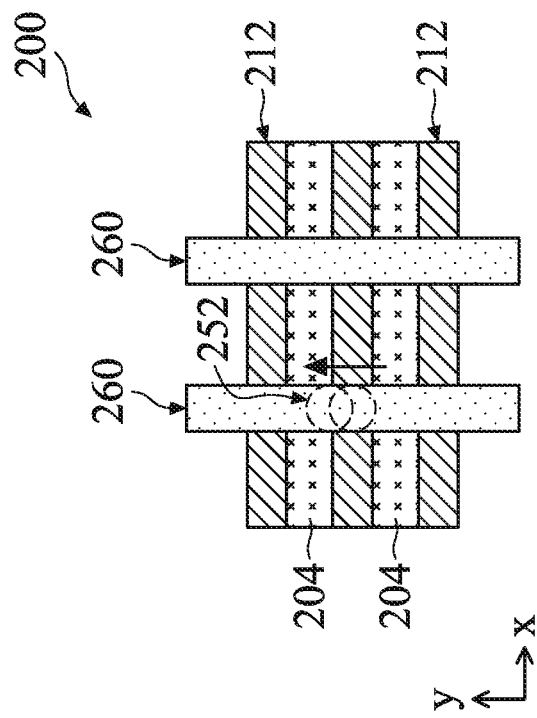
Figure 12A:
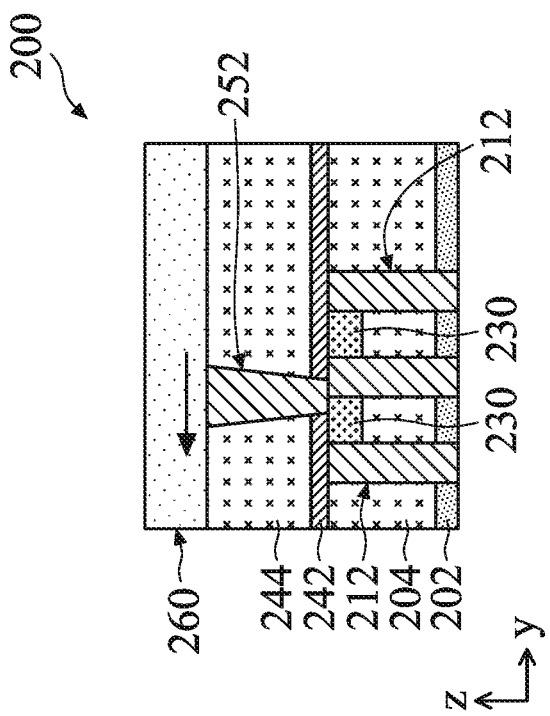

Thereafter, referring to FIGS. 12A and 12B, method 100 at operation 114 may perform additional processing steps. For example, method 100 may form additional multilayer interconnect structures, such as interconnect structure 260, over interconnect structure 200. Interconnect structure 260 may include one or more conductive features similar to conductive features 212 and 252 embedded in a dielectric layer similar to dielectric layers 204 and 244. Arrows in FIGS. 11A and 11B indicate that a position of conductive feature 252 has shifted during the patterning process, similar to embodiments depicted in FIGS. 8A-10. The subsequently formed interconnect features may implement various conductive materials such as Co, Ru, Cu, W, Ta, Ti, Al, Mo, Ir, TaN, TiN, their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

Although not intended to be limiting, one or more embodiments of the present disclosure provide many benefits to a semiconductor device and the formation thereof. The present disclosure provides methods of mitigating effects of misalignment during patterning processes that would otherwise adversely affect performance and reliability of interconnect structures in semiconductor devices. In an example embodiment, the present disclosure provides a method of forming a dielectric feature between adjacent conductive features (e.g., device-level contacts, conductive lines, vias, etc.), such that any misalignment that may have occurred when patterning and forming additional interconnect structures over the conductive features would be mitigated due to enhanced etching selectivity between the ILD layer and the dielectric feature. As a result, the dielectric feature formed in manners provided herein would allow formation of the additional interconnect structures to be self-aligned with the conductive features disposed therebelow. Additionally, the dielectric feature of the present embodiments ensures that proper insulation between the conductive features is provided during designated operating conditions, thereby improving device reliability especially with respect to events such as TDDB and VBD.

In one aspect, the present disclosure provides a method that begins with forming a first conductive feature and a second conductive feature adjacent the first conductive feature in a first dielectric layer, where the first dielectric layer includes a first dielectric material, and forming a dielectric feature in the first dielectric layer, where the dielectric feature contacts sidewalls of the first and the second conductive features and where the dielectric feature includes a second dielectric material different from the first dielectric material. The method subsequently proceeds to forming a second dielectric layer over the first dielectric layer, where the second dielectric layer includes a third dielectric material different from the second dielectric material, and forming a third conductive feature in the second dielectric layer, where the third conductive feature contacts a sidewall of the dielectric feature and either a top surface of the first conductive feature or a top surface of the second conductive feature.

In another aspect, the present disclosure provides a method that begins with forming a first conductive feature and a second conductive feature adjacent the first conductive feature in a first ILD layer, removing a portion of the first ILD layer disposed between the first and the second conductive features to form a first trench, and depositing a metal oxide layer in the first trench, wherein the metal oxide layer contacts sidewall surfaces of the first and the second conductive features. Thereafter, the method proceeds to forming an ESL over the first ILD layer, forming a second ILD layer over the ESL, and forming a third conductive feature in the second ILD layer, where the third conductive feature extends through the ESL to contact the metal oxide layer and one of the first and the second conductive features.

In yet another aspect, the present disclosure provides a semiconductor structure that includes a first conductive feature and a second conductive feature disposed in a first ILD layer and a dielectric feature disposed between sidewalls of the first and the second conductive features, where a bottom surface of the dielectric feature is above a bottom surface of each of the first and the second conductive features. The semiconductor structure further includes a second ILD layer disposed over the first ILD layer, where the dielectric feature has a composition different from compositions of the first and the second ILD layers, and a third conductive feature having sidewalls defined by the second ILD layer and a bottom surface defined by the first conductive feature or the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first conductive feature and a second conductive feature adjacent the first conductive feature in a first dielectric layer, wherein the first dielectric layer includes a first dielectric material;
   forming a dielectric feature in the first dielectric layer, wherein the dielectric feature contacts sidewalls of the first and the second conductive features, and wherein the dielectric feature includes a second dielectric material different from the first dielectric material;
   forming a second dielectric layer over the first dielectric layer, wherein the second dielectric layer includes a third dielectric material different from the second dielectric material; and
   forming a third conductive feature in the second dielectric layer, wherein a bottom surface of the third conductive feature contacts a top surface of the dielectric feature and either a top surface of the first conductive feature or a top surface of the second conductive feature.

2. The method of claim 1, wherein forming the dielectric feature includes:
   patterning the first dielectric layer to form a first trench disposed between the first and the second conductive features; and
   depositing the second dielectric material in the first trench to form the dielectric feature.

3. The method of claim 1, wherein forming the third conductive feature includes:
   patterning the second dielectric layer to form a second trench that exposes a top surface of the dielectric feature and the top surface of one of the first and the second conductive features; and
   depositing a conductive material in the second trench to form the third conductive feature.

4. The method of claim 1, further comprising forming a third dielectric layer interposed between the first and the second dielectric layer, wherein the third dielectric layer includes a fourth dielectric material different from the first and the second dielectric materials.

5. The method of claim 1, wherein the second dielectric material includes a metal oxide.

6. The method of claim 5, wherein the first and the third dielectric materials are free of any metallic element.

7. The method of claim 5, wherein the first and the third dielectric materials each include silicon, carbon, oxygen, nitrogen, or combinations thereof.

8. A method, comprising:
   forming a first conductive feature and a second conductive feature adjacent the first conductive feature in a first interlayer dielectric (ILD) layer;
   removing a portion of the first ILD layer disposed between the first and the second conductive features to form a first trench;
   depositing a metal oxide layer in the first trench, wherein the metal oxide layer contacts sidewall surfaces of the first and the second conductive features;
   forming an etch-stop layer (ESL) over the first ILD layer;
   forming a second ILD layer over the ESL; and
   forming a third conductive feature in the second ILD layer, wherein the third conductive feature extends through the ESL to contact the metal oxide layer and one of the first and the second conductive features.

9. The method of claim 8, wherein forming the third conductive feature includes:
   patterning the second ILD layer to form a second trench in a first etching process;
   removing portions of the ESL in a second etching process to expose the metal oxide layer and one of the first and the second conductive features; and
   depositing a conductive material in the second trench to form the third conductive feature.

10. The method of claim 9, wherein the first etching process is implemented at a higher etching rate than the second etching process.

11. The method of claim 9, wherein the first and the second etching processes are implemented using the same etchant.

12. The method of claim 8, wherein the metal oxide layer exhibits an etching selectivity of at least about 20 with respect to the first or the second ILD layer.

13. The method of claim 8, wherein the metal oxide layer exhibits an etching selectivity of at least about 10 with respect to the ESL.

14. The method of claim 8, wherein removing portions of the ESL removes a portion of the metal oxide layer.

15. A semiconductor structure, comprising:
   a first conductive feature and a second conductive feature disposed in a first interlayer dielectric (ILD) layer;
   a dielectric feature disposed between sidewalls of the first and the second conductive features, wherein a bottom surface of the dielectric feature is above a bottom surface of each of the first and the second conductive features;
   a second ILD layer disposed over the first ILD layer, wherein the dielectric feature has a composition different from compositions of the first and the second ILD layers; and
   a third conductive feature extending through the second ILD layer, wherein the third conductive feature has a bottom surface partially defined by a top surface of the dielectric feature.

16. The semiconductor structure of claim 15, further comprising an etch-stop layer disposed between the first and the second ILD layers, wherein a composition of the etch-stop layer is different from the composition of the dielectric feature.

17. The semiconductor structure of claim 15, wherein the first and the second ILD layers include silicon and the dielectric feature is silicon-free.

18. The semiconductor structure of claim 16, wherein the dielectric feature includes a metal oxide, a metal oxynitride, or a combination thereof.

19. The semiconductor structure of claim 15, wherein the bottom surface of the third conductive feature is partially defined by the first conductive feature or the second conductive feature.

20. The semiconductor structure of claim 18, wherein the dielectric feature exhibits a first etching selectivity with respect to the second ILD layer and a second etching selectivity with respect to the etch-stop layer, and wherein the first etching selectivity is greater than the second etching selectivity.

\* \* \* \* \*